United States Patent [19]
Bok

[11] Patent Number: 4,681,776
[45] Date of Patent: Jul. 21, 1987

[54] IMPROVED METHOD FOR DOUBLE FLOATING TRANSPORT AND PROCESSING OF WAFERS

[75] Inventor: Edward Bok, Dr Badhoevedorp, Netherlands

[73] Assignee: Integrated Automation Limited, Badhoevedorp, Netherlands

[21] Appl. No.: 823,419

[22] PCT Filed: Jun 3, 1985

[86] PCT No.: PCT/NL85/00021
§ 371 Date: Jan. 28, 1986
§ 102(e) Date: Jan. 28, 1986

[87] PCT Pat. No.: WO 85/05757
PCT Pub. Date: Dec. 19, 1985

[30] Foreign Application Priority Data
Jun. 4, 1984 [NL] Netherlands .......................... 8401776

[51] Int. Cl.[4] .......................... B08B 5/04; B44C 1/22; B05D 5/12; C23C 13/08
[52] U.S. Cl. ........................................ 427/85; 134/21; 134/34; 156/345; 156/646; 427/240; 427/255.5
[58] Field of Search ................. 118/50, 718, 719, 720; 134/21, 32, 34; 156/345, 646; 226/97; 406/86; 427/85, 255.5, 299, 434.3, 434.5

[56] References Cited
U.S. PATENT DOCUMENTS
4,495,024 1/1985 Bok ..................................... 156/646
4,544,446 10/1985 Cady .................................... 156/639

FOREIGN PATENT DOCUMENTS
37923 4/1981 Japan .

Primary Examiner—Michael R. Lusignan
Attorney, Agent, or Firm—David H. Semmes; Warren E. Olsen

[57] ABSTRACT

Method of transporting and processing of substrates. Particularly, transporting the substrate in a double floating mode within a confined passageway and selectively rotating the substrate within the passageway by applying pressurized fluid medium across the planar surface of the substrate. Processing of the substrate may be accomplished during the rotating by directing processing agents such as cleaning medium, rinsing medium, developing agent, etching agent, and the like, onto a surface of the substrate.

26 Claims, 8 Drawing Figures

IMPROVED METHOD FOR DOUBLE FLOATING TRANSPORT AND PROCESSING OF WAFERS

The invention relates to an improved apparatus for double floating transport and processing of wafers.

In for instance the Dutch Patent Application Nos. 8 103 979 and 8 300 649 of applicant systems are described for double floating transport and processing of wafers, whereby in the tunnel passageway during processing the wafer with a linear displacement thereof does not intentionally rotate.

However, with some processings it is desirable, that temporary such wafer rotation takes place.

The present invention satisfactorily solves the problem, whereby during such processing a rotation of the wafer is accomplished by means of flows of fluid, which, discharged from the supply manifolds, strike the wafer in the desired direction of wafer rotation and subsequently are carried off through discharge manifolds.

Thereby by increasing the tunnel passage height it is possible to attain a very large number of revolutions per minute.

Furthermore, it is often desirable, that the wafer at least temporarily, for instance one second, has a negligible displacement in linear direction.

To meet such requirement, a following positive feature of the apparatus is, that as seen in the direction of linear displacement of the wafer, in the central section of rotation a lower pressure is maintained in the tunnel than in the adjacent tunnel sections.

With for instance cleaning and rinsing of the wafer it is advisable, that a large number of high intensity flows of liquid strike the wafer surface. Thereby such medium must be removed as fast as possible.

To enable this, a following positive feature is, that as seen in direction of linear displacement of the wafer, in the tunnel sidewalls only a restricted number of groups of supply manifolds are positioned, however extending over at least the width of the wafer.

As a result, the size of these channels can be considerably larger.

A following very positive feature is, that the wafer rotation cannot only be accomplished by means of flows of liquid, but also by means of flows of gaseous medium. Thereby an improved processing can take place, with a complete change of medium, if required.

Furthermore, the apparatus can be structured such, that this wafer rotation can be maintained during a subsequent displacement of this wafer.

Thereby another positive feature is, that these flows, accomplishing the wafer rotation, cooperate with flows of processing medium, establishing the linear wafer displacement.

Furthermore, it is of importance, that as the supply pressure is maximal in that tunnel section, also the discharge of medium is maximal, enabling the pressure in this tunnel section to remain within allowable parameters.

In addition, it is desirous, that as the flows of liquid result in a surface tension of the tunnel sidewalls, such tension is as small as possible.

For that reason another positive feature is, that the tunnel height in the process section is at least locally considerably larger than is required for a double floating wafer transport with a minimum consumption of transport medium.

The required locally increased pressure in the tunnel passageway may not affect the double floating wafer transport in that tunnel, as for instance in the pressure adaption modules towards or from vacuum modules.

Therefore another positive feature is, that in the tunnel displaceable valve plates are incorporated, which during such processing seal off the adjacent tunnel sections from the processing section.

Furthermore, the spinning velocity can be very high, for instance 10,000 rpm, as could be required for an improved processing, such as the fast removal of liquid remnants from the water surface.

The spin system is also very suitable to apply a coating on a wafer, whereby in particular the considerable acceleration and de-acceleration of the wafer are important.

Furthermore, any material for the process section, such as for instance teflon for a dopant coater, can be used.

Furthermore, in the process area of the process section discharge manifolds may not be positioned, with almost entirely a discharge of the medium, supplied through the upper tunnel wall, through discharge manifolds, positioned in the lower tunnel wall.

Furthermore, the process system can be adapted to any type of wet processing and such including wet cleaning by means of ultrasonic or megasonic energy and etching therewith.

The foregoing and other objects, features and advantages of the invention will be more apparent from the following more particular description, as illustrated in the accompanying drawings:

FIG. 1 schematically shows the principle of double floating wafer spinning in the tunnel passageway of the apparatus according to the invention.

FIG. 2 schematically shows the principle of double floating wafer spinning combined with a linear wafer displacement in the tunnel passageway.

Figure 1:
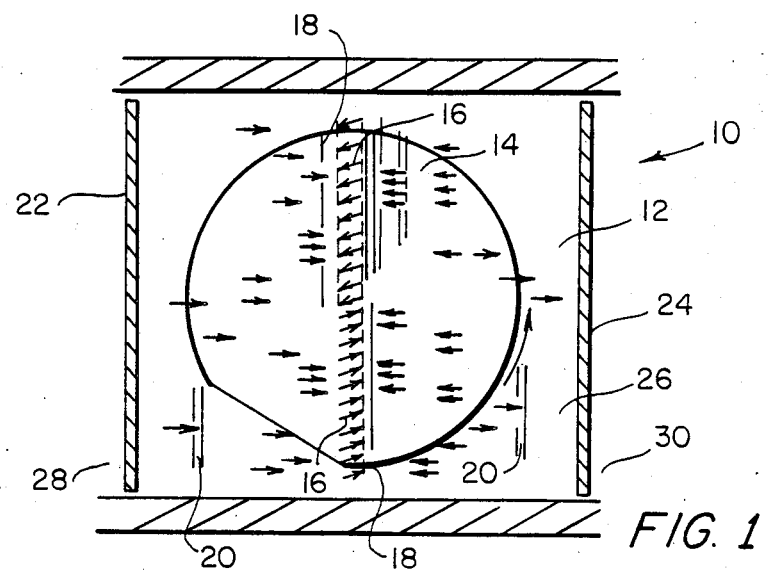

In FIG. 1 apparatus 10 is shown. Thereby in tunnel 12 transport and processing of wafers 14 take place under double floating condition.

By means of medium flows 16 a spinning of this wafer is accomplished, because the resulting forces of these flows provide a spinning moment.

During such spinning the wafer 14 is kept on its place because a maximal discharge takes place through the discharge manifolds 18. Such discharge is larger than that through the manifolds 20, which are positioned aside this spin centre.

During the spin processing the then closed valve plates 22, 24 seal off the processing section 26 from the adjacent tunnel sections 28 and 30, if required.

Such temporary sealing-off can also be accomplished by means of an established gas lock, including an intensified supply of gaseous medium and a increased discharge capacity in such lock. Thereby such supply and discharge taking place through a large number of channels, arranged on both sides of the tunnel passageway and extending laterally of this tunnel.

Figure 2:
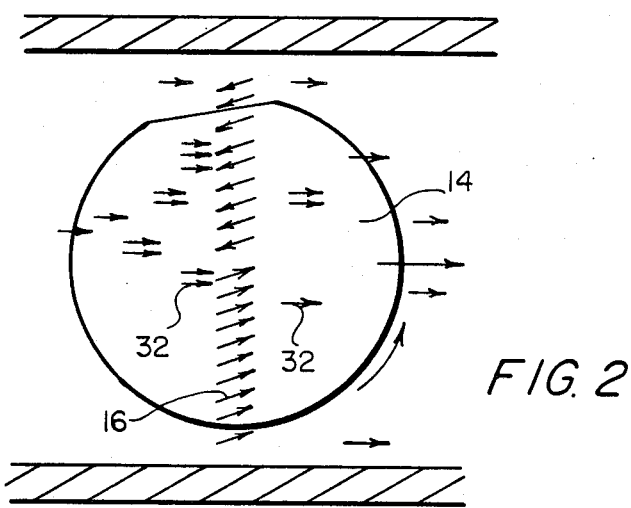

In FIG. 2 the spin medium 16 cooperates with medium flows 32, enabling a combined spinning and linear displacement of the wafer.

Figure 3:
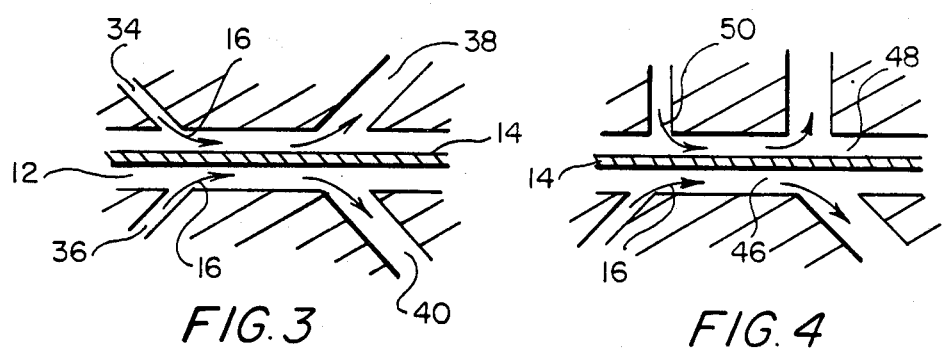
FIG. 3 is a detailed sectional view of the tunnel in the area of supply and discharge manifolds for spinning.

In FIG. 3 on both sides of the tunnel 12 the supply manifolds 34 and 36 together with the respective discharge manifolds 38 and 40 extend into passage 42. Flows of medium 16, urged through these manifolds 34 and 36, strike the wafer 14, move along the wafer surface and are subsequently discharged through the discharge manifolds 38 and 40.

Figure 4:
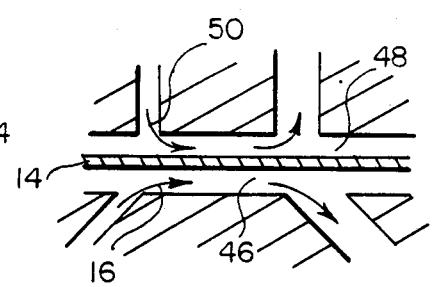
FIG. 4 is a detailed sectional view of a modified tunnel with spinning supply and discharge manifolds on one side of the wafer and discharge manifolds for a linear wafer displacement on the other side.

In FIG. 4 by means of flows 16, in lower gap 46 striking the bottom side of the wafer 14, a spinning thereof is established, whereas in the upper gap 48 processing of this wafer takes place. Such processing might be any type of wet processing, including cleaning and etching by means of ultrasonic or megasonic energy and the applying of coating, whereby the spinner can have a considerable radial velocity, for instance 10 000 rpm and temporary no rotation or a negligible rotation.

Thereby in the upper gap 48 the double floating condition might be maintained by means of gaseous medium 50. Such medium might also be used for the linear displacement of the wafer.

Within the scope of the invention such wet processing includes the processing on both sides of the wafer.

Figure 5:
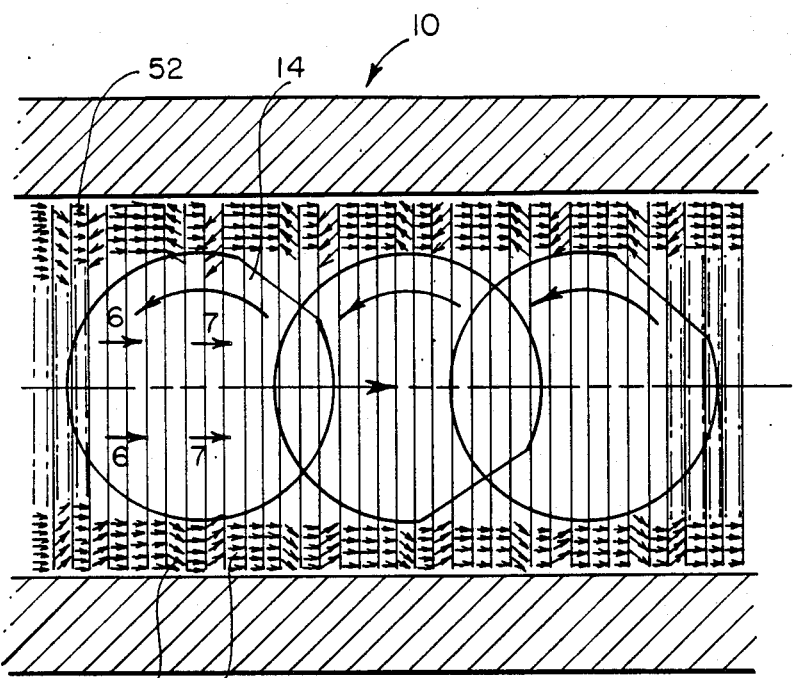
FIG. 5 shows a tunnel section, wherein different groups of medium flows strike the wafer.

In FIG. 5 the tunnel section 52 is shown, whereby over a considerable length both linear displacement and rotation of the wafer is established. Such by means of numerous flows 16 and 32.

Figure 6:
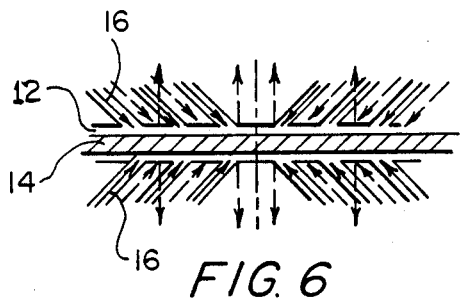
FIG. 6 is a cross-sectional view over line 6—6 of the tunnel section according to FIG. 5.
Figure 7:
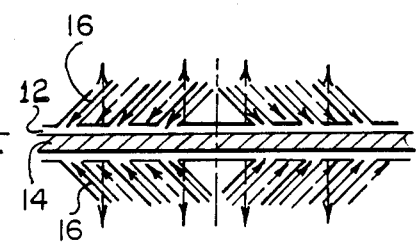
FIG. 7 is a cross sectional view over line 7—7 of the tunnel section according to FIG. 5.

Thereby these flows can strike the wafer in any direction, as is indicated in FIGS. 6 and 7, and can be a combination of gaseous and fluid medium.

As a result, by means of these flows a highly effective, two sided wet cleaning or etching of the wafer is made possible, because each surface segment of the wafer is hit for many times by these flows and such under various angles.

Furthermore it is possible, that in the upper gap 48 coating of the wafer takes place by means of medium in liquid phase, whereas on the other side for instance the spinning under floating condition is accomplished by means of a thinner of such coating, whether or not in combination with gaseous medium.

Figure 8:
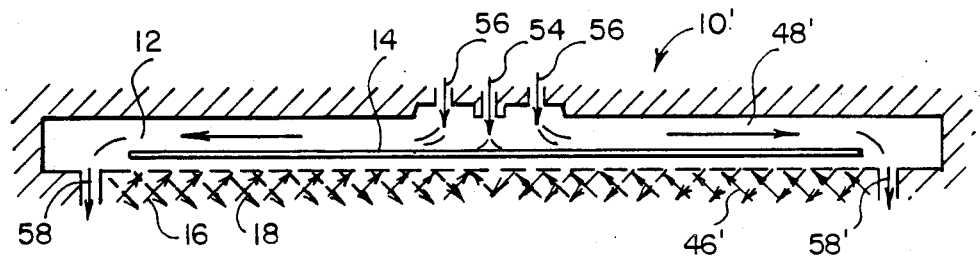
FIG. 8 shows a coating application section of a modified apparatus.

In FIG. 8 the coating station of the apparatus 10 is shown. Thereby by means of cooperating flows of medium 16 and other, not indicated media the wafer is temporarily kept in the coating application section.

Through channel 54 photoresist is applied on the wafer, whereby by means of the flows 16 during a short period of time a relatively low radial velocity of for instance 400 rpm is maintained for the wafer.

Thereafter the wafer rotation is accelerated to for instance 5,000 rpm and is maintained for instance 8 seconds.

As a result, the coating is evenly spread over the wafer surface and whereby excessive coating is released from the sides of the wafer.

Thereafter the radial velocity is further increased to for instance 7,000 rpm and whereby by means of a whether or not increased supply of nitrogen through manifolds 56 a drying of the applied coating takes place. The discharge of this medium occurs for at least part thereof through discharge manifolds 58, positioned on the bottom side of the tunnel.

Because of the restricted discharge capacity the upper gap 48' can have a relatively large height, which prevents a coverage of the upper sidewall of the tunnel passageway with coating.

Within the scope of the invention other structures of the tunnel are possible and can, effect whether or not temporarily, variations in the flows of the media, as for instance by means of the ultrasonic or megasonic energy.

Furthermore, such spin processing can include the use of a spin table, having a smaller size than the wafer to be processed and which table is part of the double floating transport system. Thereby such wafer might temporary rest on this table.

Furthermore, any type of material, such as stainless steel, quartz, and trademarked plastics such as "plexiglass" and "teflon" are possible. for the tunnel structure or part thereof.

It is possible, that with correctly measured supplies and discharges of the different media in relation with the successive process stations, unallowable pressure differences in the tunnel passageway, affecting the transport and processing of the wafers, cannot take place. As a result, there will be no need for the use of the valve plates 22 and 24, which helps in the control of contamination in the tunnel passageway.

For instance, during the spin processing the discharge capacity in the process section is maximal, with an established pressure in the concerned tunnel area, which can even be lower than that in the adjacent tunnel sections.

As the wafers displace in the transport sections of this tunnel, then a change in wafer velocity as the result of differences in pressure in the spin process section and observed by sensors will immediately result in providing signals from these sensors towards control systems for immediate corrections in the supply and discharge of these sections.

Thereby the distance between successive wafers can be so large, that differences in wafer velocity are allowable.

I claim:

1. Method of double floating transporting and processing wafers within a confined passageway comprising:
   a. supplying a fluid medium through a plurality of supply channels intersecting the passageway and,
   b. discharging said fluid medium through a plurality of discharge channels intersecting such passageway adjacent said supply channels, such that moving fluid medium cushions while transporting the wafer within said passageway; and
   c. selectively rotating said wafer within said passageway by flowing pressurized fluid medium across the planar surface of said wafer and in the desired direction of rotation.

2. Method of transporting and processing wafers within a confined passageway as in claim 1, wherein said transporting of said substrate is in a double floating mode and including enhancing rotating of said wafer by supplying fluid medium through axially opposed series of angular supply channels extending across at least one planar surface of said wwafer.

3. Method of transporting and processing wafers within a confined passageway as in claim 1, including maintaining said wafer in relatively stationary suspension within said passageway during said rotating by varying said supplying of fluid medium.

4. Method of transporting and processing wafers within a confined passageway as in claim 1, including during said rotating of said wafer, simultaneously supplying said fluid medium towards both planar sides of said wafer.

5. Method of transporting and processing wafers within a confined passageway as in claim 3, including during said rotating directing pressurized fluid medium in axially aligned series onto one planar surface of said wafer, while supplying pressurized fluid medium to the other surface of said wafer to maintain double floating condition.

6. Method of transporting and processing said wafers within a confined passageway as in claim 4, wherein said rotating of said wafer exceeds 5,000, rpm.

7. Method of transporting and processing wafers within a confined passageway as in claim 4, including varying the pressure of said supplying of fluid medium into the passageway adjacent said rotating, such that longitudinal displacement of said wafer is controlled.

8. Method of transporting and processing wafers within a confined passageway as in claim 7, wherein the pressure of said fluid medium being supplied to the passageway adjacent said rotating is above atmospheric pressure.

9. Method of transporting and processing wafers within a confined passsageway as in claim 8, including directing processing medium onto said wafer during said rotating.

10. Method of transporting and processing wafers within a confined passageway as in claim 9, including maintaining the pressure of supplied fluid medium during said rotating and processing is lower than the pressure of the supplied fluid medium in sections of said passageway adjacent said rotating and processing.

11. Method of transporting and processing wafers within a confined passageway as in claim 10, wherein said directing of processing medium extends over a portion of the passageway at least as long as said wafer.

12. Method of transporting and processing wafers within a confined passageway as in claim 4, wherein said rotating of said wafer is at least temporarily effected by continuously supplying pressurized fluid medium in configuration as a rotating radial segment extending across the planar surface of the wafer.

13. Method of transporting and processing wafers within a confined passageway as in claim 12, wherein said processing includes directing cleaning medium on at least one wafer.

14. Method of transporting and processing wafers within a confined passageway as in claim 12, wherein said processing includes directing rinsing medium on at least one side of said wafer.

15. Method of transporting and processing wafers within a confined passageway as in claim 12, wherein said processing includes drying of said wafer.

16. Method of transporting and processing wafers within a confined passageway as in claim 12, wherein said processing includes directing developing agent onto said wafer.

17. Method of transporting and processing wafers within a confined passageway as in claim 12, wherein said processing includes directing etching agent onto said wafer.

18. Method of transporting and processing wafers within a confined passageway as in claim 12, including temporarily securing said wafer by suction during said rotating.

19. Method of transporting and processing wafers within a confined passageway as in claim 18, wherein during said securing of said wafer by suction, said wafer is suspended temporarily without rotating.

20. Method of transporting and processing wafers within a confined passage way as in claim 18, wherein said processing includes directing coating agent onto said wafer.

21. Method of transporting and processing wafers within a confined passageway as in claim 20, wherein said processing includes directing cleaning agent onto said wafer.

22. Method of transporting and processing wafers within a confined passageway as in claim 20, wherein said processing includes directing stripping agent onto said wafer.

23. Method of transporting and processing wafers within a confined passageway as in claim 20, wherein said processing includes directing etching agent onto a surface of the wafer.

24. Method of transporting and processing wafers within a confined passageway as in claim 20, wherein said processing includes directing dopant onto a surface of the wafer.

25. Method of transporting and processing wafers within a confined passageway as in claim 18, wherein said processing includes directing developing agent surface of the wafer.

26. Method of transporting and processing wafers within a confined passageway as in claim 10, including sealing off said passageway on both sides of said rotating and processing of said wafer.

* * * * *